United States Patent [19]

Yasuda et al.

[11] Patent Number: 5,347,592
[45] Date of Patent: Sep. 13, 1994

[54] PATTERN JUDGING METHOD AND MASK PRODUCING METHOD USING THE PATTERN JUDGING METHOD

[75] Inventors: Hiroshi Yasuda; Satoru Yamazaki; Kiichi Sakamoto, all of Kawasaki, Japan

[73] Assignee: Fujitsu Limited, Kanagawa, Japan

[21] Appl. No.: 917,260

[22] Filed: Jul. 23, 1992

[30] Foreign Application Priority Data

Jul. 29, 1991 [JP] Japan .................................. 3-188787

[51] Int. Cl.$^5$ .............................................. G06K 9/00
[52] U.S. Cl. .......................................... 382/8; 382/1; 348/87
[58] Field of Search ................ 382/8, 33, 1; 358/101; 364/560, 571.04; 348/86, 87, 126

[56] References Cited

U.S. PATENT DOCUMENTS 5,046,012  9/1991  Morishita et al. ...................... 382/8

FOREIGN PATENT DOCUMENTS 52-119185  10/1977  Japan .......................... H01L 21/26
62-260322  11/1987  Japan .......................... H01L 21/30

Primary Examiner—David K. Moore
Assistant Examiner—D. R. Anderson
Attorney, Agent, or Firm—Nikaido, Marmelstein, Murray & Oram

[57] ABSTRACT

A pattern judging method which is to be implemented on a computer automatically determines whether or not a pattern should be prohibited from being formed in a mask. The pattern judging method includes the steps of (a) dividing an area of the mask where a desired pattern is to be formed into a plurality of regions, (b) calculating a predetermined physical quantity for each of the regions for a case where one or a plurality of openings corresponding to the desired pattern are formed in the mask, and (c) prohibiting the desired pattern from being formed in the mask if the predetermined quantity calculated in the step (b) exceeds a threshold value for at least one of the regions.

15 Claims, 13 Drawing Sheets

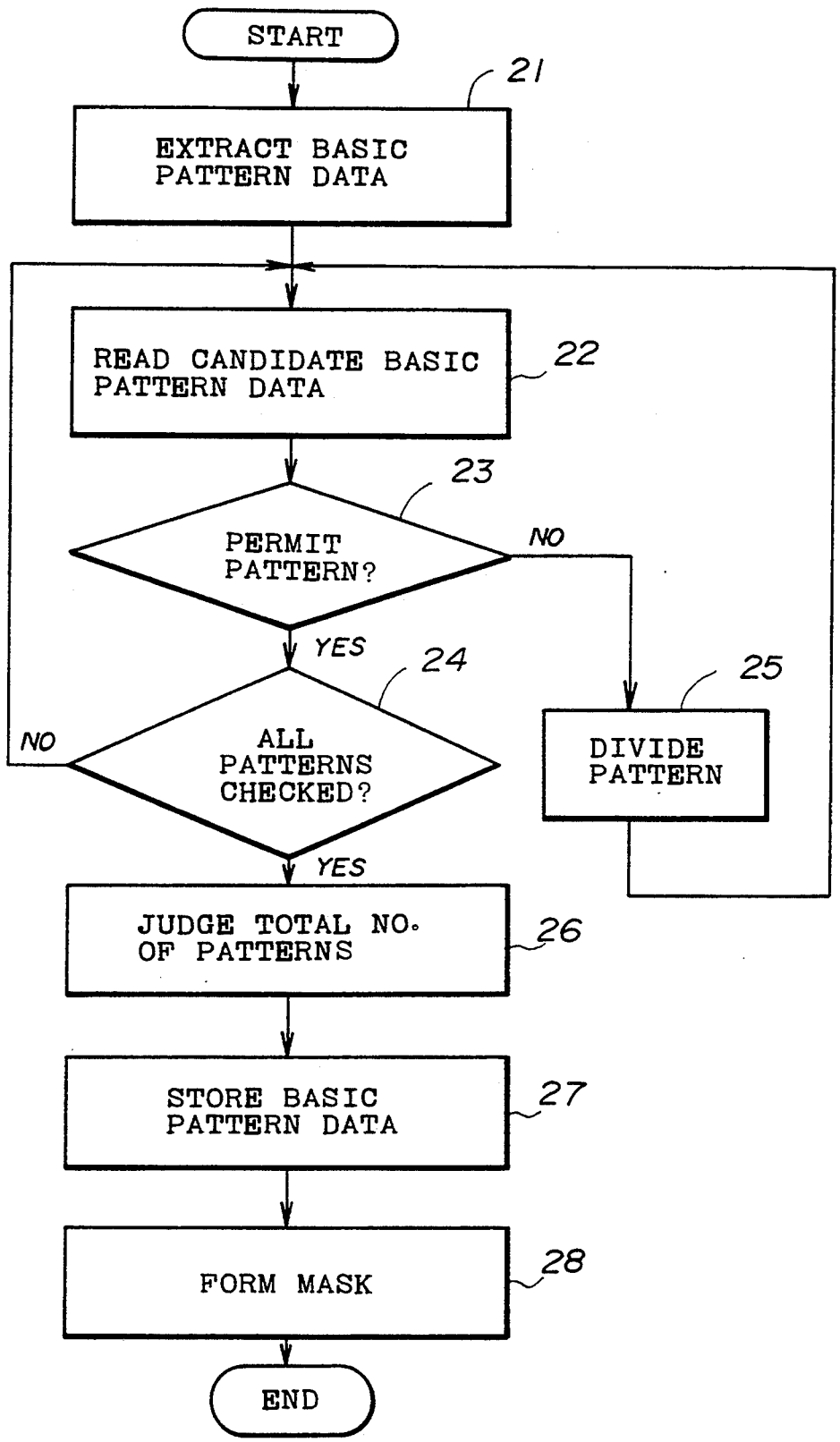

FIG. 15(A)
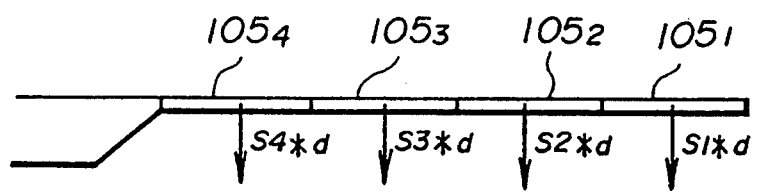
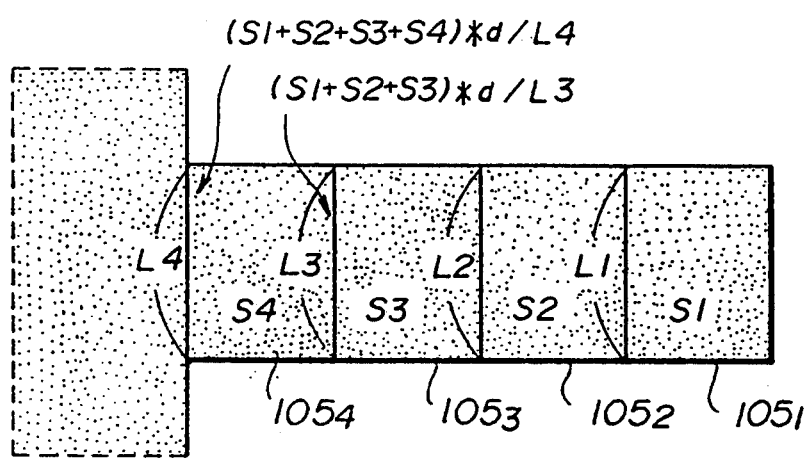
FIG. 15(B)

PATTERN JUDGING METHOD AND MASK PRODUCING METHOD USING THE PATTERN JUDGING METHOD

FIELD OF THE INVENTION

The present invention generally relates to pattern judging methods and mask producing methods using the pattern judging method, and more particularly to a pattern judging method which judges whether or not a pattern may be arranged within a region of a mask which is used for a charged particle beam exposure and to a mask producing method which uses such a pattern judging method.

BACKGROUND OF THE INVENTION

Recently, due to the further increase in the integration density of large scale integrated circuits (LSIs), charged particle beam exposure methods such as an electron beam exposure method is expected to replace the photolithography technique which was conventionally used to expose fine patterns. The charged particle beam exposure method has many advantageous features. First, the stable drawing of fine patterns and the alignment accuracy can be controlled in a satisfactory manner. Second, a satisfactory focal depth is obtainable, and it is possible to guarantee no defects in the drawn patterns because no mask is used, thereby improving the reliability of the LSI. Third, it is possible to considerably improve the production yield at fine pattern regions of the LSI.

Therefore, the charged particle beam exposure method is characterized in that rectangular shots of the charged particle beam are made on an object surface and fine patterns on the order of microns or less can be drawn on the object surface. However, the charged particle beam exposure method draws the patterns by connecting the rectangular shots, and the patterns are drawn by a single stroke of the charged particle beam. As a result, the number of shots per unit area increases considerably as the size of the patterns decreases, and the throughput becomes poor when drawing the fine patterns.

On the other hand, in many situations, the patterns to be exposed include repeating patterns. Hence, the so-called block exposure method was developed. This block exposure method uses a mask which includes a plurality of openings for exposing basic patterns in a single shot of the charged particle beam which has a rectangular cross section, where the basic pattern forms a unit of the repeating pattern within the patterns which are to be drawn. According to the block exposure method, the basic patterns are repeatedly exposed and connected, so that the desired patterns are exposed at a high speed.

The mask which is provided with the openings corresponding to the basic patterns are often referred to as a block mask or a stencil mask, and the basic patterns are arranged in blocks of the block mask. For example, the basic patterns have rectangular or triangular shapes, so that the cross section of the charged particle beam transmitted through the opening of the block mask is shaped into such shapes. Further, the cross section of the charged particle beam transmitted through the opening of the block mask can be varied by partially or totally irradiating the opening by the charged particle beam. When making the block mask, it is essential that the openings corresponding to the basic patterns have shapes which are not easily damaged.

For example, the block exposure method which uses the block mask is proposed in a Japanese Laid-Open Patent Application No. 52-119185. Furthermore, the exposure method which uses the block mask provided with openings corresponding to repeating patterns of a memory cell or the like and to general rectangular patterns is proposed in a Japanese Laid-Open Patent Application No. 62-260322, for example.

The block exposure method is particularly effective when exposing patterns in which a majority of the exposing area is made up of a repetition of basic patterns. Hence, even for semiconductor devices such as a 64 Mbit dynamic random access memories (DRAMs) and 256 Mbit DRAMs which require extremely fine patterns, it is possible to obtain a satisfactory throughput which would enable mass production of such semiconductor devices by employing the block exposure method.

In order to efficiently carry out the exposure employing the block exposure method, openings corresponding to a plurality of basic patterns are provided in the block mask, and the opening corresponding to an arbitrary one of the basic patterns is selectively used. The opening is selected by deflecting the charged particle beam by a deflector having a relatively large deflection range, and the charged particle beam is deflected by a deflector having a relatively small deflection range if the charged particle beam is to partially irradiate the selected opening.

The shapes of the openings corresponding to the basic patterns must be limited to a certain extent, because some shapes cannot be realized on the block mask and the block mask will easily be damaged at parts where extremely complicated shapes are formed. In other words, not all kinds of basic patterns can be realized by use of the block mask. Conventionally, the shapes of the basic patterns obtained from the basic pattern data (block pattern data) are checked by the human eye to determine whether or not each pattern can be realized on the block mask and whether or not to allow each pattern to be provided on the block mask. Accordingly, it was conventionally necessary for an experienced and skilled operator to make the above check.

FIG. 1 shows examples of basic patterns which are prohibited from being provided on the block mask. In FIG. 1, the basic patterns, that is, the openings in the block mask if provided thereon, are indicated by non-hatched portions while the parts of the block mask having no opening are indicated by hatchings.

FIG. 1 (A) shows a rectangular frame shaped basic pattern. In this case, an opening 111 is formed around a rectangular region 110. However, since the rectangular region 110 cannot connect to a part of the block mask, it is physically impossible to realize this basic pattern.

FIG. 1 (B) shows a sideways U-shaped basic pattern. In this case, an opening 113 is formed adjacent to three sides of a rectangular tongue region 112. According to this basic pattern, there is a relatively long head conduction path, and the basic pattern is easily damaged because the temperature at the rectangular tongue region 112 easily rises to a high temperature.

FIG. 1 (C) shows a sideways C-shaped basic pattern. In this case, an opening 115 is formed adjacent to three sides of a rectangular region 114, and the remaining side of the rectangular region 114 connects to the surrounding via a narrow connecting part 114a. According to this basic pattern, the connecting part 114a narrow and may not be able to sufficiently support the weight of the rectangular region 114.

FIG. 1 (D) shows a basic pattern which corresponds to the surrounding of an L-shape. In this case, openings 117a and 117b surround an L-shaped region 116. According to this basic pattern, the L-shaped region 116 is narrow and is weak from the point of view of the tension introduced at this part.

FIG. 1 (E) shows a basic pattern which is made up of two parallel bands. In this case, openings 119a and 119b sandwich a narrow band-shaped region 118. According to this basic pattern, the narrow band-shaped region 118 easily breaks.

FIG. 1 (F) shows a basic pattern having the shape shown. In this case, openings 121a through 121d surround a narrow intersecting region 120. According to this basic pattern, the narrow intersecting region 120 easily breaks.

Conventionally, the above described basic patterns shown in FIG. 1 which should be prohibited from being provided on the block mask are checked by the human eye. However, the conditions under which the basic patterns to be prohibited are judged by such a check cannot be indicated by numerical values because the check relies on the human eye, and the conventional check is totally dependent on the experience and skills of the operator who makes the check.

Therefore, there was a problem in that the basic patterns which may or may not be provided on the block mask cannot be judged objectively and accurately for all kinds of basic patterns. As a result, the basic patterns provided on the block mask may easily be damaged and broken due to heat and insufficient support, and on the other hand, the basic patterns which will not generate problems and may actually be provided on the block mask may be prohibited from being provided on the block mask as a result of the check which relies on the human eye.

SUMMARY OF THE INVENTION

Accordingly, it is a general object of the present invention to provide a novel and useful pattern judging method and a mask producing methods using the pattern judging method, in which the problems described above are eliminated.

Another and more specific object of the present invention is to provide a pattern judging method to be implemented on a computer for automatically judging whether or not a pattern should be prohibited from being formed in a mask, comprising the steps of (a) dividing an area of the mask where a desired pattern is to be formed into a plurality of regions, (b) calculating a predetermined physical quantity for each of the regions for a case where one or a plurality of openings corresponding to the desired pattern are formed in the mask, and (c) prohibiting the desired pattern from being formed in the mask if the predetermined quantity calculated in the step (b) exceeds a threshold value for at least one of the regions. According to the pattern judging method of the present invention, it is possible to automatically make an objective judgement as to whether the desired pattern should be prohibited from being formed in the mask, and there is not need to rely on the experience and skills of the operator who conventionally made the judgement. In addition, the judgement is accurate.

Still another object of the present invention is to provide a mask producing method for producing a mask which is used for drawing patterns on an object by a charged particle beam transmitted through the patterns of the mask, comprising the steps of (a) extracting a pattern data related to a desired pattern which is to be formed in the mask, (b) dividing an area of the mask where the desired pattern is to be formed into a plurality of regions, (c) calculating a predetermined physical quantity for each of the regions for a case where one or a plurality of openings corresponding to the desired pattern are formed in the mask, based on the extracted pattern data, (d) judging whether or not the predetermined quantity calculated in the step (c) exceeds a threshold value for all of the regions, and (e) forming the one or plurality of openings corresponding to the desired pattern in the mask if the step (d) judges that the predetermined quantity does not exceed the threshold value for all of the regions. According to the mask producing method of the present invention, it is possible to form only those patterns which are judged objectively as being permitted on the mask, and thus, it is possible to prevent a pattern which would easily break or become damaged from being formed on the mask.

Other objects and further features of the present invention will be apparent from the following detailed description when read in conjunction with the accompanying drawings.

BRIEF DESCRIPTION OF THE DRAWINGS

FIG. 3 is a flow chart for explaining an embodiment of a mask producing method according to the present invention;

FIGS. 15(A)–15(B) are diagrams for explaining the physical quantity which is used when making a pattern check.

DESCRIPTION OF THE PREFERRED EMBODIMENTS

Figure 2:
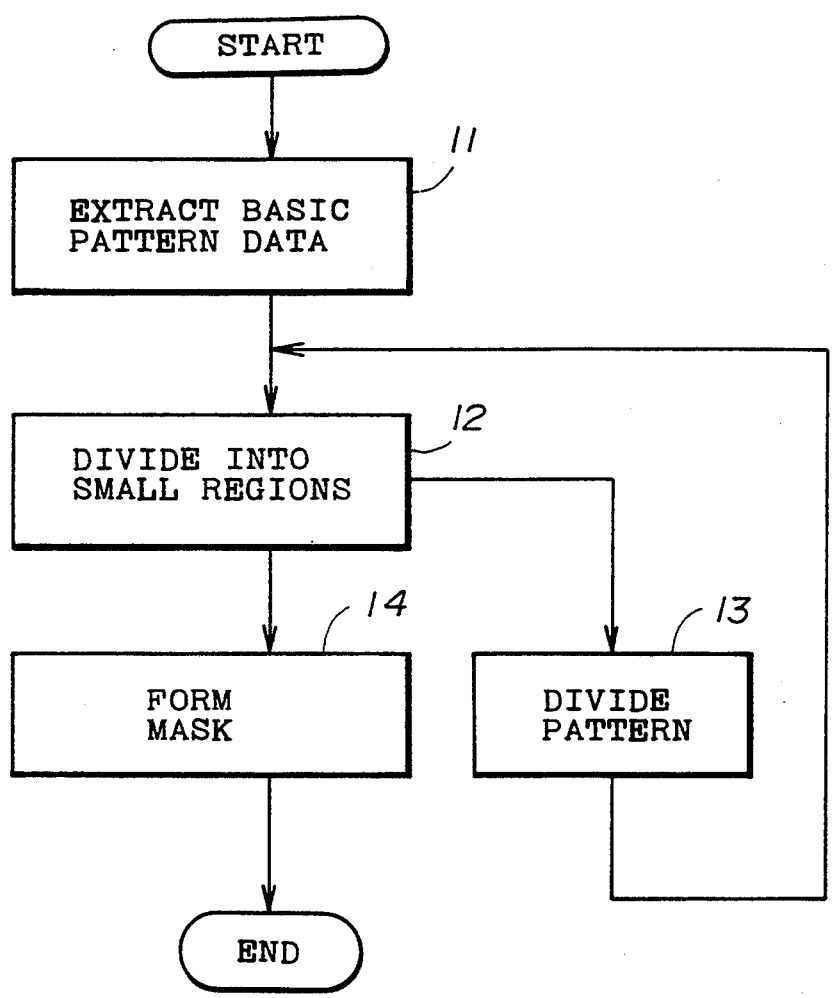
FIG. 2 is a flow chart for explaining the operating principle of the present invention.

First, a description will be given of the operating principle of the present invention, by referring to FIG. 2. FIG. 2 generally shows a mask producing method according to the present invention which uses a pattern judging method according to the present invention. The mask is provided with a plurality of openings corresponding to desired patterns, and is used for a charged particle beam exposure method. A charged particle beam is irradiated on the mask, and the charged particle beam transmitted through the opening exposes an object surface. By repeating this exposure process, it is possible to expose a repeating pattern on the object surface.

In FIG. 2, a first step 11 extracts data of basic patterns from a pattern data which is related to a pattern which is to be exposed. The basic pattern forms a pattern unit which is repeatedly used. A step 12 divides into a plurality of small regions the mask which would be formed if the openings of the basic patterns are provided based on the basic pattern data extracted in the step 11. In addition, the step 12 detects whether or not a predetermined physical quantity calculated for each of the divided regions is greater than or equal to a set value.

If the predetermined physical quantity is detected as being greater than or equal to the set value in the step 12, a step 13 in this case divides the basic pattern into two or more mutually independent patterns or, into one or more rectangular patterns and one arbitrary pattern. After dividing the basic pattern in the step 13, the process returns to the step 12 and the new patterns which are obtained by the division are respectively used as new basic patterns.

A step 14 forms the shape of the basic pattern on a mask based on the data of the basic pattern which is detected in the step 12 as having the predetermined physical quantity which is less than the set value for each of the small regions.

According to the present invention, it is judged that the basic pattern should be prohibited from being formed on the mask if the predetermined physical quantity of the small region is greater than or equal to the set value. In other words, the present invention uses an objective judging condition, namely, whether or not the predetermined physical quantity is greater than or equal to the set value.

As one example of the predetermined physical quantity, there is a temperature rise which occurs when the charged particle beam is irradiated on the mask. The aspect of the pattern described by the temperature distribution when this temperature rise occurs generally matches the condition for prohibiting the formation of the pattern on the mask. In addition, it is important to know the temperature rise which occurs when the charged particle beam is irradiated on the mask.

Next, a description will be given of an embodiment of the mask producing method according to the present invention, by referring to FIG. 3. In FIG. 3, a step 21 extracts from the pattern data which is related to an LSI pattern data and is stored in a file the data which are related to the basic patterns that form the units which are repeatedly used. This step 21 corresponds to the step 11 shown in FIG. 2.

Then, out of the basic patterns indicated by each of the extracted basic pattern data, a step 22 reads out the data related to the candidate basic patterns in a sequence starting from the basic pattern having a largest product of the number of times the basic pattern is used within the LSI pattern which is to be exposed and the number of shots of an electron beam within the basic pattern. In this embodiment, the electron beam is used as the charged particle beam.

Figure 1:
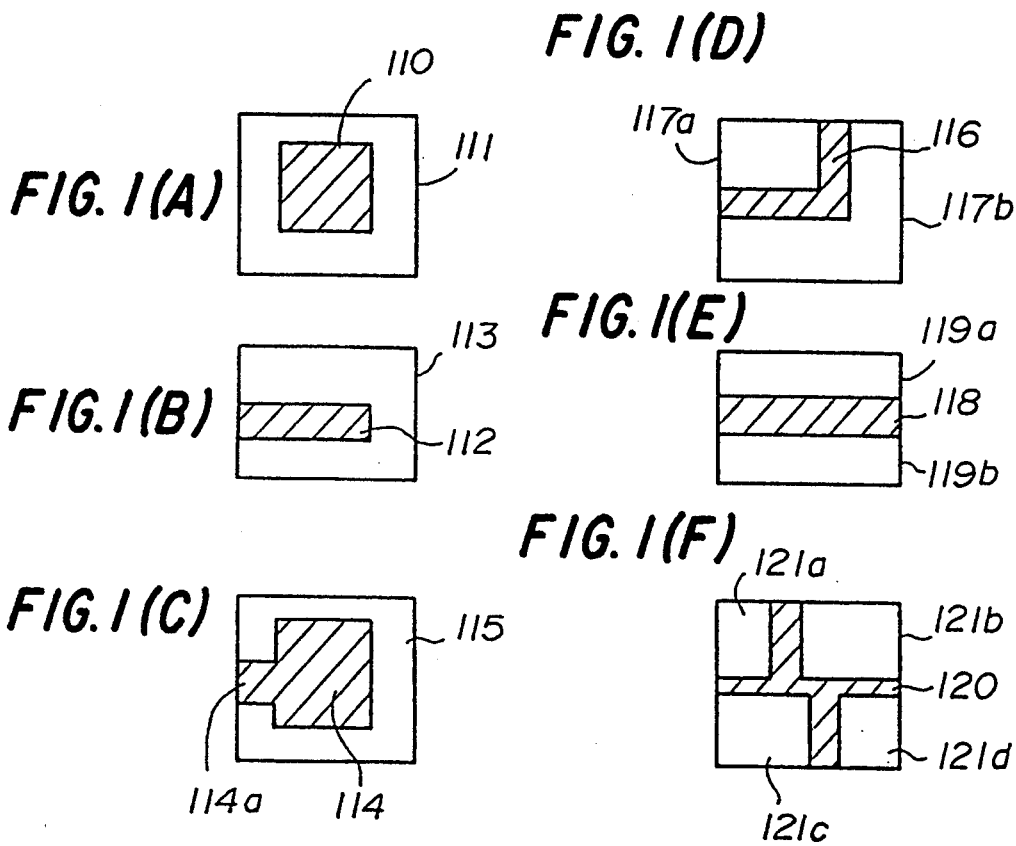
FIGS. 1(A)–1(F) are plan views showing examples of basic patterns which should be prohibited from being provided on a block mask.

A step 23 decides whether or not the basic pattern should be permitted, that is, not be prohibited from being formed on a stencil mask, based on the candidate basic pattern data read out in the step 22. This step 23 of making the pattern prohibit check corresponds to the step 12 shown in FIG. 2. In this embodiment, the step 23 calculates the temperature rise which occurs when the electron beam irradiates the opening of the stencil mask corresponding to the candidate basic pattern, based on the candidate basic pattern data, and makes the above pattern prohibit check based on whether or not the calculated temperature rise is greater than or equal to a threshold value. In addition, the pattern such as that shown in FIG. 1(A) is also included in the prohibiting condition (Coulomb condition) which prohibits the pattern from being formed on the stencil mask.

In this embodiment, the temperature rise of the stencil mask is used as the physical quantity which determines the prohibiting condition, because the aspect of the patterns indicated by the temperature distribution generally matches other prohibiting factors.

Figure 4A:
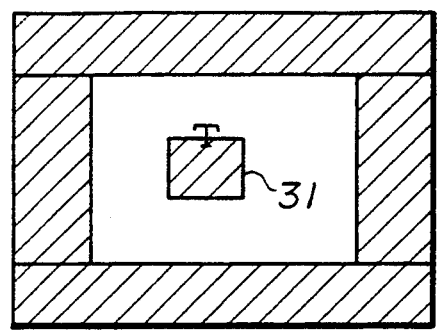
FIGS. 4(A) through 4(C) are plan views for explaining temperature rises which occur in the case of patterns which should be prohibited from being formed on a stencil mask.

For example, in the case of a pattern shown in FIG. 4A, the heat which is generated at a central rectangular region 31 which is indicated by hatchings due to the electron beam irradiation cannot discharged to other regions indicated by hatchings, and as a result, a temperature T at the rectangular region 31 becomes high.

Figure 4B:
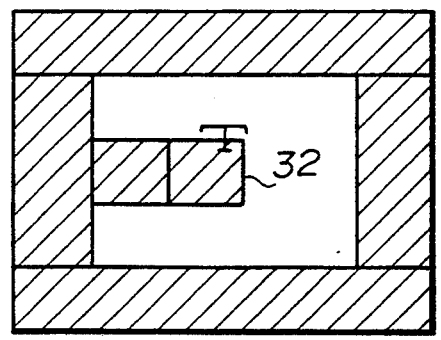

On the other hand, in the case of a pattern shown in FIG. 4B, the heat which is generated at a central rectangular tongue region 32 which is indicated by hatchings due to the electron beam irradiation can only discharge to the left connecting region indicated by hatchings, and the temperature T at the rectangular tongue region 32 also becomes high. Similar problems occur in the case of the patterns shown in FIG. 1(B), (C), (D) and (E).

Figure 4C:
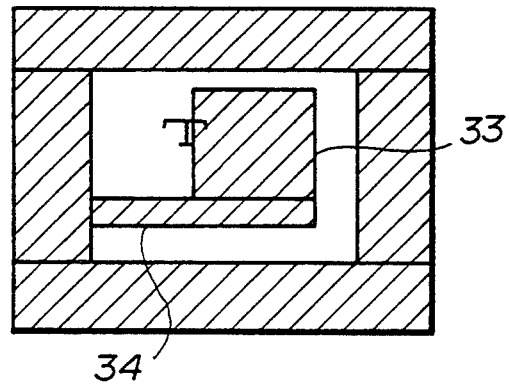

Furthermore, in the case of a pattern shown in FIG. 4C, a central rectangular region 33 which is indicated by hatchings is connected to the surrounding region indicated by hatchings via a narrow connecting part 34 which is indicated by hatchings. However, the connecting part 34 cannot support the weight of the rectangular region 33 if the connecting part 34 is narrow, and this pattern must be prohibited from being formed on the stencil mask. In this case, it becomes more difficult for the heat generated at the rectangular region 33 due to the electron beam irradiation to discharge as the connecting part 34 becomes narrower, and the temperature T at the rectangular region 33 becomes high.

Next, a more detailed description will be given of the step 23 shown in FIG. 3, that is, an embodiment of the pattern judging method according to the present invention, by referring to FIG. 5.

Figure 5:
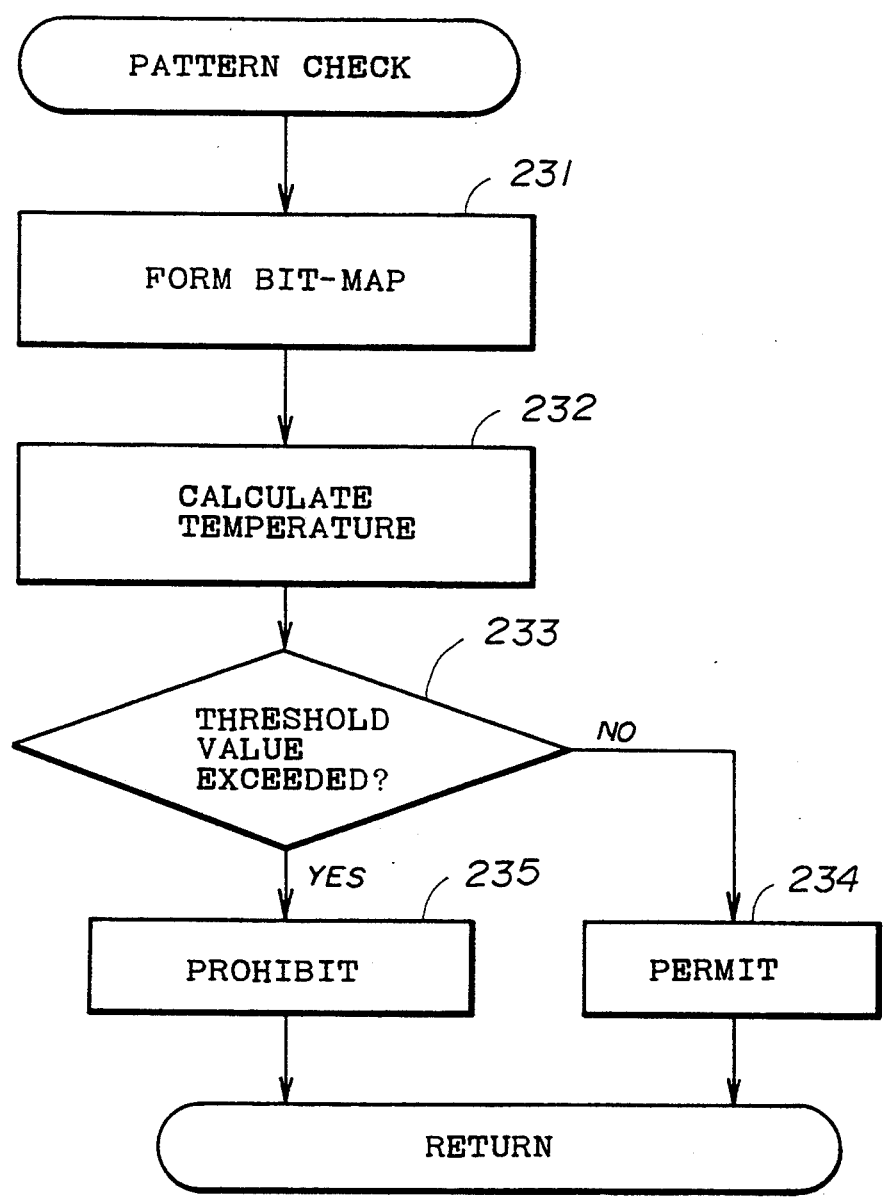
FIG. 5 is a flow chart for explaining an embodiment of a pattern judging method according to the present invention.

In FIG. 5, a step 231 divides the top surface of the stencil mask into a plurality of small regions and forms a bit-map of the openings of the candidate basic patterns which are to be formed on the stencil mask based on the candidate basic pattern data, where the bit-map describes each of the small regions by 1-bit.

Figures 6, 7:
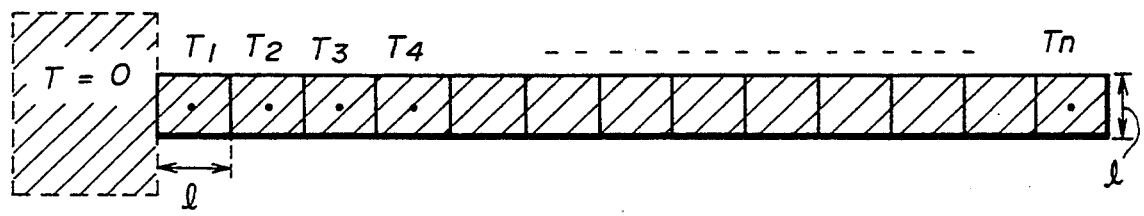
FIG. 6 is a plan view showing rectangular small regions of the stencil mask.
FIG. 7 is a plan view for explaining the temperature at various parts of an elongated plate shaped pattern of the stencil mask.

FIG. 6 shows the small regions of the stencil mask. In the case shown, the top surface of the stencil mask is divided into 8 small regions in the vertical direction and 8 small regions in the horizontal direction. More particularly, the size of each small region is 10 μm square. If the magnification of the stencil mask is 100 times, the size of the pattern exposed on the object surface is 0.1 μm square. Accordingly, a pattern region having the size of 400 μm square is divided into 1600 small regions (meshes) respectively having the size of 10 μm square and including 40 small regions arranged in the vertical direction and 40 small regions arranged in the horizontal direction.

If the pattern data is developed on the region of the stencil mask which is divided into the small regions, the bit-map is formed such that the small region is "0" if the opening exists at this small region, and the small region is "1" if the opening does not exist at this small region.

Returning now to the description of the pattern judging method shown in FIG. 5, a step 232 sets up an equation related to the thermal conduction for each of the small regions, and solves the simultaneous equation so as to calculate the temperature by the finite difference method. For example, as shown in FIG. 7, the temperature for the case where the electron beam is irradiated on an elongated plate shaped part of the stencil mask is denoted by $T_1, T_2, T_3, \ldots, T_n$ in a sequence starting from a leftmost square small region having a side of l μm, and the thickness of the stencil mask is denoted by t μm, where the temperature is taken at the center of each small region.

In this case, a heat quantity $q_1$ of the heat which flows to the left in FIG. 7 from the leftmost square small region can be described by the following if a heat value per unit square μm is denoted by q.

$$q_1 = KT_1 t = nql^2$$

Similarly, heat quantities $q_2, \ldots, q_n$ of the heat which flows to the left in FIG. 7 from the second, ..., nth leftmost square small regions can be described by the following, where k denotes the thermal conductivity.

$$q_2 = k(T_1 - T_2)t = (n-1)ql^2$$
$$\vdots$$
$$q_n = k(T_n - T_{n-1})t = ql^2$$

If the central terms and the right terms are all added, the following formulas are obtained.

$$kT_n = ql^2 n(n+1)/2$$
$$T_n = ql^2 n(n+1)/2kt$$

If it is assumed that q=3 μW/μm², k (silicon)=168 μW/μmK and nl=L, the following formula can be derived.

$$T = 3L^2/300t = 0.01L^2/t$$

Hence, the following values can be calculated from the temperature T, for example.

T=160° C. when t=10 μm and L=400 μm

T=40° C. when t=10 μm and L=200 μm

T=20° C. when t=20 μm and L=400 μm

The heat quantity q per unit square μm can be obtained in the following manner. If it is assumed that the mask magnification is 100 times, 50% of the electrons passing through the stencil mask are cut by the round aperture, the current density on the object surface is 50 A/cm², the acceleration voltage is 30 kV and the thickness of the stencil mask is 20 μm, a current density J on the stencil mask becomes 0.01 A/cm² ($=50\times 2\times (10^{-2})^2$).

The wattage is 30 kV or, 300 W/cm² ($=J\times 30000$), and the heat quantity q per unit square μm can be described by the following formula.

$$q = 300\times 10^{-8} W/\mu m^2 = 3 \mu W/\mu m^2$$

Figure 8:
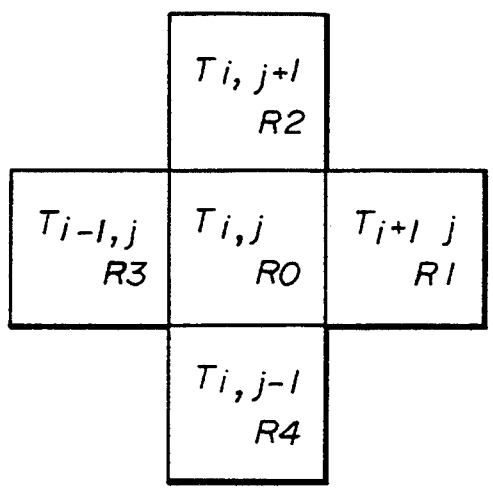
FIG. 8 is a diagram for explaining a computer simulation to calculate the temperature of each small region.

In this embodiment, the temperature for each of the small regions is calculated by computer simulation using the finite difference method. In other words, when obtaining a temperature $T_{i,j}$ of a region R0 in FIG. 8, a calculation shown in a formula (1) is made based on temperatures $T_{i+1,j}, T_{i,j+1}, T_{1-1,j}$ and $T_{i,j-1}$ of four regions R1, R2, R3 and R4 which are adjacent to the region R0, a thermal conductivity $K_i$ between the regions R0 and Ri (i=1, ..., 4), a length l of each side of the regions R0 through R4, a thickness t of the stencil mask and the heat value q per unit square μm.

$$K_1(t_{i,j} - T_{i+1,j}) + K_2(T_{i,j} - T_{i,j+1}) + \quad (1)$$
$$K_3(T_{i,j} - T_{i-1,j}) + K_4(T_{i,j} - T_{i,j-1}) = ql^2/t$$

If a pattern does not exist (that is, no opening exists) in the region R0 and a pattern exists (that is, an opening exists) in at least one of the adjacent regions R1 through R4, it is assμmed for the sake of convenience that an extremely thin film exists in this region having the pattern (opening). Assuming that the adjacent region R1 includes the pattern (opening), $K_1$ in this case is set equal to $k/10^4$, where k denotes the thermal conductivity of the stencil mask.

The above measure is taken with respect to the adjacent region R1 because no solution can be obtained if the thermal conductivity $K_1$ between the region R0 including no pattern and the adjacent region R1 including the pattern is set to zero. By setting $K_1$ to an extremely small value $k/10^4$ which is essentially negligible, it becomes possible to obtain the solution.

On the other hand, if the pattern (opening) exists in the region R0, the heat value q on the right term of the formula (1) is set to zero and the thermal conductivities $K_1$ through $K_4$ for the adjacent regions R1 through R4 are respectively set to $k/10^4$.

Figure 9:
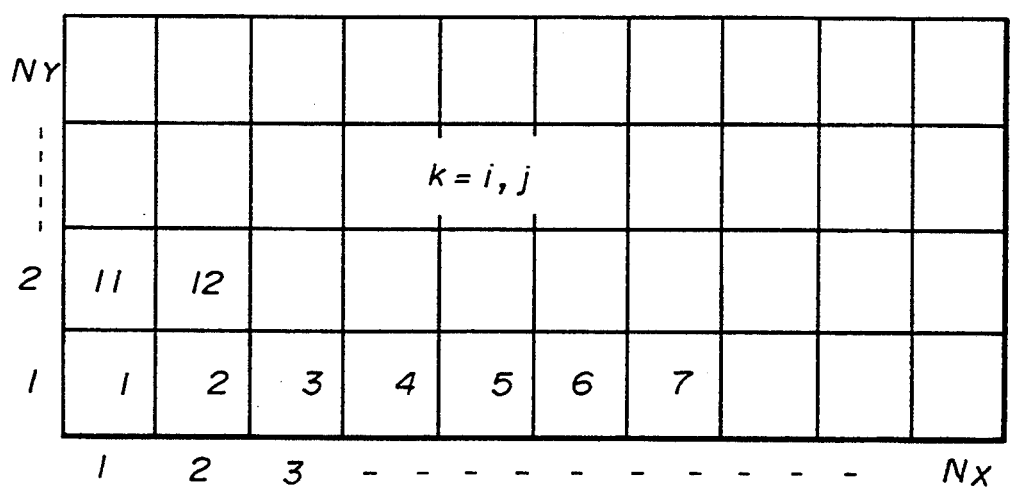
FIG. 9 is a diagram for explaining the rectangular small regions of the stencil mask.
Figure 10A:
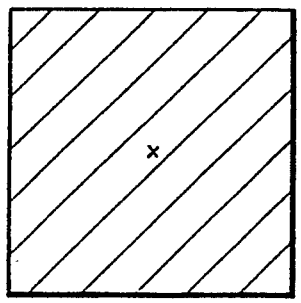
FIG. 10(A)–(G) are plan views showing typical examples of the basic patterns.
Figure 10B:
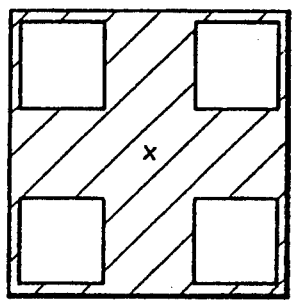
Figure 10C:
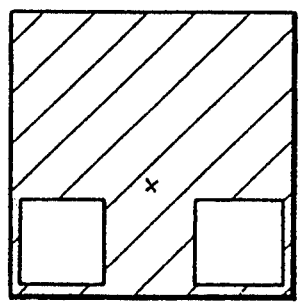
Figure 10D:
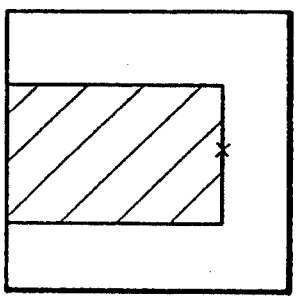
Figure 10E:
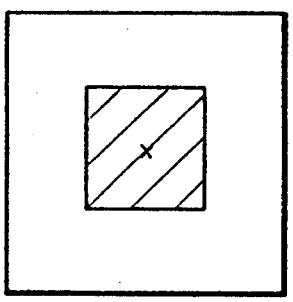
Figure 10F:
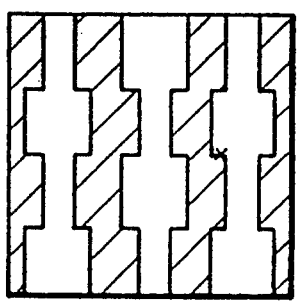
Figure 10G:
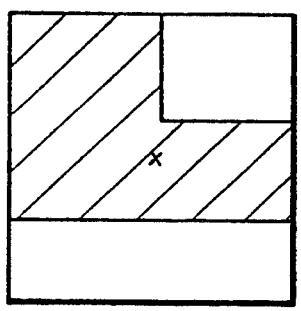

Under such conditions, the formula (1) is calculated for each of the rectangular small regions which are made up of Ny (for example, 40) small regions arranged in the vertical direction and Nx (for example, 40) small regions arranged in the horizontal direction as shown in FIG. 9.

FIG. 10 shows typical examples of basic patterns, where parts of the stencil mask having no opening is indicated by hatchings and thus the openings are indicated by non-hatched while portions. The formula (1) was calculated at a point x for each of the basic patterns shown in FIG. 10 (A) through (G) under the condition that t=20 μm, q=3 μW/μm², K=168 μW/μmK and the rectangular region (block) has an area of 400 μm square. The calculated maximum temperatures are as follows.

| FIG. 10 (A) | T = 11° C. |
|---|---|
| FIG. 10 (B) | T = 15.3° C. |
| FIG. 10 (C) | T = 12.6° C. |
| FIG. 10 (D) | T = 44° C. |
| FIG. 10 (E) | T = 36281° C. |
| FIG. 10 (F) | T = 22.88° C. |
| FIG. 10 (G) | T = 16.1° C. |

In the case of the basic pattern shown in FIG. 10 (A), the temperature at the point x is the lowest among the basic patterns shown in FIG. 10 because no opening is formed and the generated heat conducts to the surrounding parts of the stencil mask. On the other hand, in the case of the basic pattern shown in FIG. 10 (E), the heat at the point x cannot conduct to the surrounding parts of the stencil mask because the central rectangular region which includes the point x is completely surrounded by the opening. As a result, the temperature at the point x in FIG. 10 (E) is extremely high.

In the case of the basic pattern shown in FIG. 10 (D) which has the sideways U-shape, the temperature at a point x which is located at the tip end position of the rectangular tongue region is 44° C. at the maximum and relatively high. On the other hand, in the case of the basic patterns shown in FIG. 10 (B), (C), (F) and (G), the temperatures at points x are all 25° C. or less at the maximum.

Returning now to the description of the pattern judging method shown in FIG. 5, a step 233 decides whether or not the maximum temperatures which are calculated for each of the small regions in the step 232 is greater than or equal to a threshold value. For example, this threshold value is set to 30° C.

A step 234 judges that the basic pattern may be formed in the stencil mask if the decision result in the step 233 is NO, and in this case, the decision result in the step 23 is YES. But a step 235 judges that the basic pattern should be prohibited from being formed in the stencil mask if the decision result in the step 233 is YES, and in this case, the decision result in the step 23 is NO. Accordingly, if the threshold value is set to 30° C. for the basic patterns shown in FIG. 10, the step 235 prohibits the basic patterns shown in FIG. 10 (D) and (E) from being formed in the stencil mask, while the step 234 permits the other basic patterns shown in FIG. 10 (A), (B), (C), (F) and (G) to be formed on the stencil mask.

Returning now to the description of the process shown in FIG. 3, a step 24 is carried out if the step 23 permits the basic pattern to be formed in the stencil mask. The step 24 decides whether or not all of the candidate basic patterns have been checked. The process returns to the step 22 if there is a next candidate basic pattern data which is to be checked and the decision result in the step 24 is NO, so as to repeat a process similar to that described above with respect to the next candidate basic pattern data.

On the other hand, a step 25 is carried out if the step 23 prohibits the basic pattern from being formed in the stencil mask. The step 25 divides the basic pattern, and each of pattern data related to divided portions of the basic pattern are input to the step 22 as the candidate basic pattern data.

The step 25 corresponds to the step 13 shown in FIG. 2. If the step 23 judges that the basic pattern shown in FIG. 11 (A) should be prohibited from being formed in the stencil mask, the basic pattern is divided horizontally into a group of three rectangular patterns shown in FIG. 11 (B) and is also divided vertically into a group of four rectangular patterns shown in FIG. 11 (C). These two groups of mutually independent patterns shown in FIG. 11 (B) and (C) are stored in the memory as candidate basic patterns and read out when making the pattern judgement. Of course, the method of dividing the basic pattern which is prohibited from being formed in the stencil mask is not limited to that shown in FIG. 11, and may be divided into one or a plurality of rectangular patterns and one other pattern.

When all of the candidate basic pattern data are checked, the decision results in the steps 23 and 24 are both YES, and a step 26 judges the total number of candidate basic patterns based on the candidate basic pattern data which are related to the basic patterns which are permitted to be formed in the reticle mask as a result of the pattern judgement. A step 27 stores in the memory the data related to a tolerable number of basic patterns which may be formed in the stencil mask.

If the total number of candidate basic patterns exceeds the tolerable number of basic patterns which may be formed in the stencil mask, those basic patterns which are most frequently used are selected and the data related thereto are stored in the memory with priority over other less frequently used basic patterns. Those basic patterns which are not selected and thus not formed in the stencil mask can be exposed using the exposure which varies the size of the exposed rectangular pattern by varying the area of the rectangular opening irradiated by the electron beam which has a rectangular cross section.

Finally, a step 28 reads out the basic pattern data from the memory, and forms in the stencil mask the openings which correspond to the basic patterns described by the basic pattern data. This step 28 corresponds to the step 14 shown in FIG. 2.

Figures 11A, 11B, 11C:
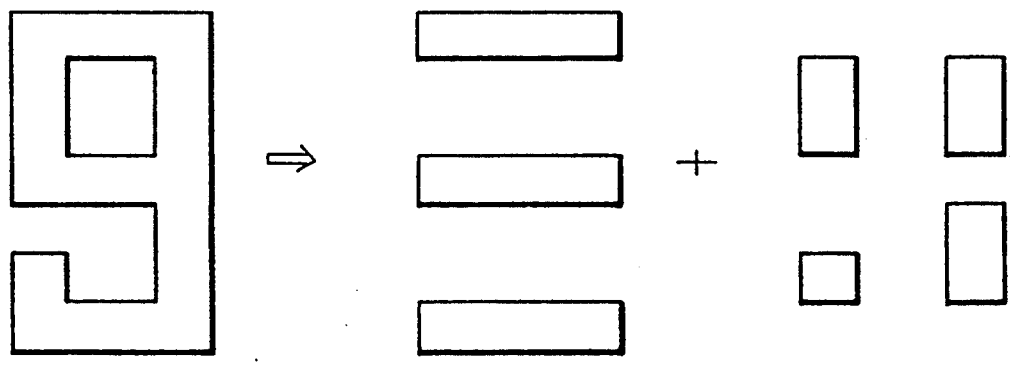
FIGS. 11(A)–11(C) are plan views for explaining a method of dividing a basic pattern into groups of patterns.
Figure 12A:
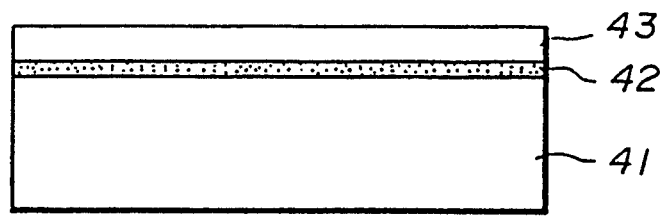
FIGS. 12(A)–12(D) are cross sectional views showing a stencil mask at essential stages of its production.
Figure 12B:
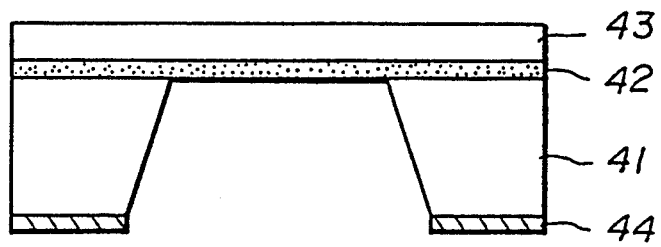
Figure 12C:
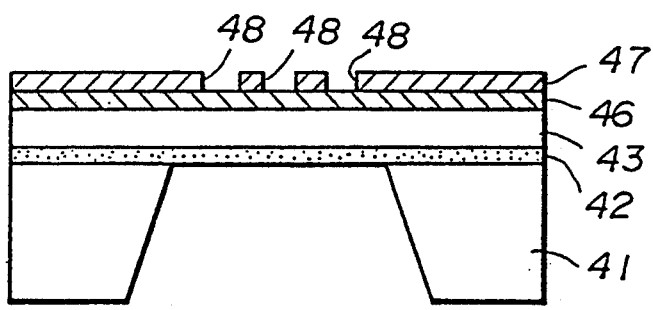
Figure 12D:
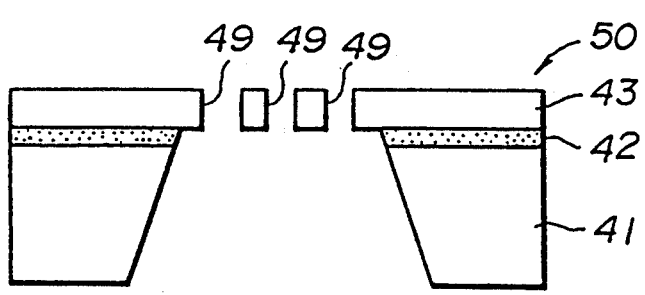

Next, a description will be given of the process of forming the stencil mask, by referring to FIG. 12. First, a silicon dioxide (SiO₂) layer is formed on one of two mirror surfaces of a silicon (Si) wafer which has a thickness of 500 μm, and two such Si wafers are stacked at the SiO₂ layers and is subjected to a high voltage pulse under a high temperature condition of approximately 800° C. The two SiO₂ layers of the two Si wafers become bonded by electrostatic bonding. Thereafter, one of the two Si wafers is polished down to a thickness of 20 μm, so as to form a bonded wafer structure shown in FIG. 11 (A). In FIG. 11 (A), a first wafer 41 has a thickness of 500 μm, a second wafer 43 has a thickness of 20 μm, and an oxide (SiO₂) layer 42 is provided between the first and second wafers 41 and 43. In this case, the top surfaces of the first and second wafers 41 and 43 respectively correspond to the (111) face and the (100) face.

Thereafter, an etching mask which has a central opening and is made of a SiO₂ or a silicon nitride (Si₃N₄) layer is formed on the bottom surface of the first wafer 41, and a wet etching is carried out using an etchant such as potassium hydroxide (KOH). As a result, the etching progresses at a predetermined angle with respect to the bottom surface of the first wafer 41 corresponding to the (111) face, and the etching stops at the oxide layer 42 as shown in FIG. 11 (B).

Then, as shown in FIG. 11 (C), an oxide ($SiO_2$) layer 46 and a resist layer 47 are successively formed on the top surface of the second wafer 43, and the basic patterns are drawn on the resist layer 47 by the electron beam based on the basic pattern data which are stored in the memory in the step 27 shown in FIG. 3. After the resist layer 47 is developed, openings 48 corresponding to the basic patterns are formed by a patterning as shown in FIG. 11 (C).

Next, the patterned resist layer 47 is used as a mask to remove a portion of the oxide layer 46. In addition, the resist layer 47 is removed, and further, the second wafer 43 is etched by use of the remaining oxide layer 46 as a mask and a predetermined etching gas such as HBr so as to form trenches. Finally, by removing the oxide layers 46 and 42, a stencil mask 50 shown in FIG. 11 (D) is formed. As shown, this stencil mask 50 has a thickness of 20 $\mu$m and is provided with openings 49 which correspond to the basic patterns.

Of course, the openings 49 of the stencil mask 50 may form only one kind of basic pattern. However, in order to efficiently carry out the exposure, a plurality of basic patterns are formed in the stencil mask 50.

Figure 13:
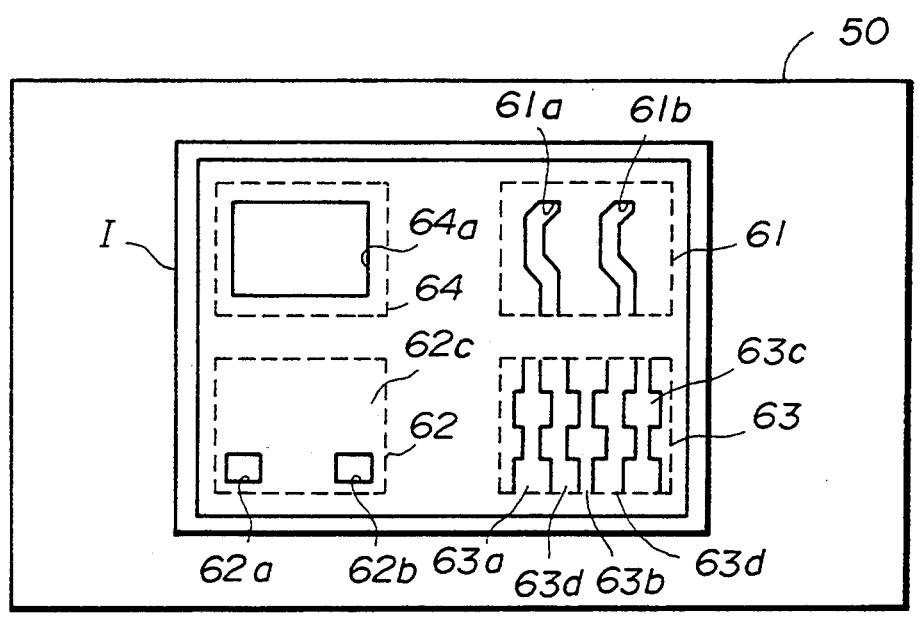
FIG. 13 is a plan view showing a stencil mask which is produced by the embodiment of the mask producing method according to the present invention.

FIG. 13 shows a stencil mask 50 which is produced by the embodiment of the mask forming method according to the present invention described above. This stencil mask 50 includes blocks 61 through 64.

The block 61 includes openings 61a and 61b which correspond to a basic pattern. The block 62 is made up of openings 62a and 62b which correspond to a basic pattern, and a region 62c in which no opening is formed. The block 63 is made up of openings 63a through 63c which correspond to a basic pattern, and a region 63d in which no opening is formed. Each basic pattern within one block can be drawn by one shot of the electron beam.

The block 64 includes a rectangular opening 64a. The rectangular opening 64a is used when making the exposure which varies the size of the exposed rectangular pattern by varying the area of the rectangular opening irradiated by the electron beam which has the rectangular cross section.

The group of patterns, that is, the four blocks 61 through 64, are arranged within a deflection region I in which the electron beam can be deflected. A plurality of such groups of patterns may be provided on the stencil mask 50 at predetermined intervals, but only one group of patterns is shown in FIG. 13 so as to simplify the drawing. Furthermore, one shot of the electron beam irradiates one block at one time, and the area irradiated by the electron beam is slightly greater than or equal to the area of one block indicated by a dotted line in FIG. 13.

Next, a description will be given of an application of the stencil mask 50 in an electron beam exposure apparatus shown in FIG. 14.

Figure 14:
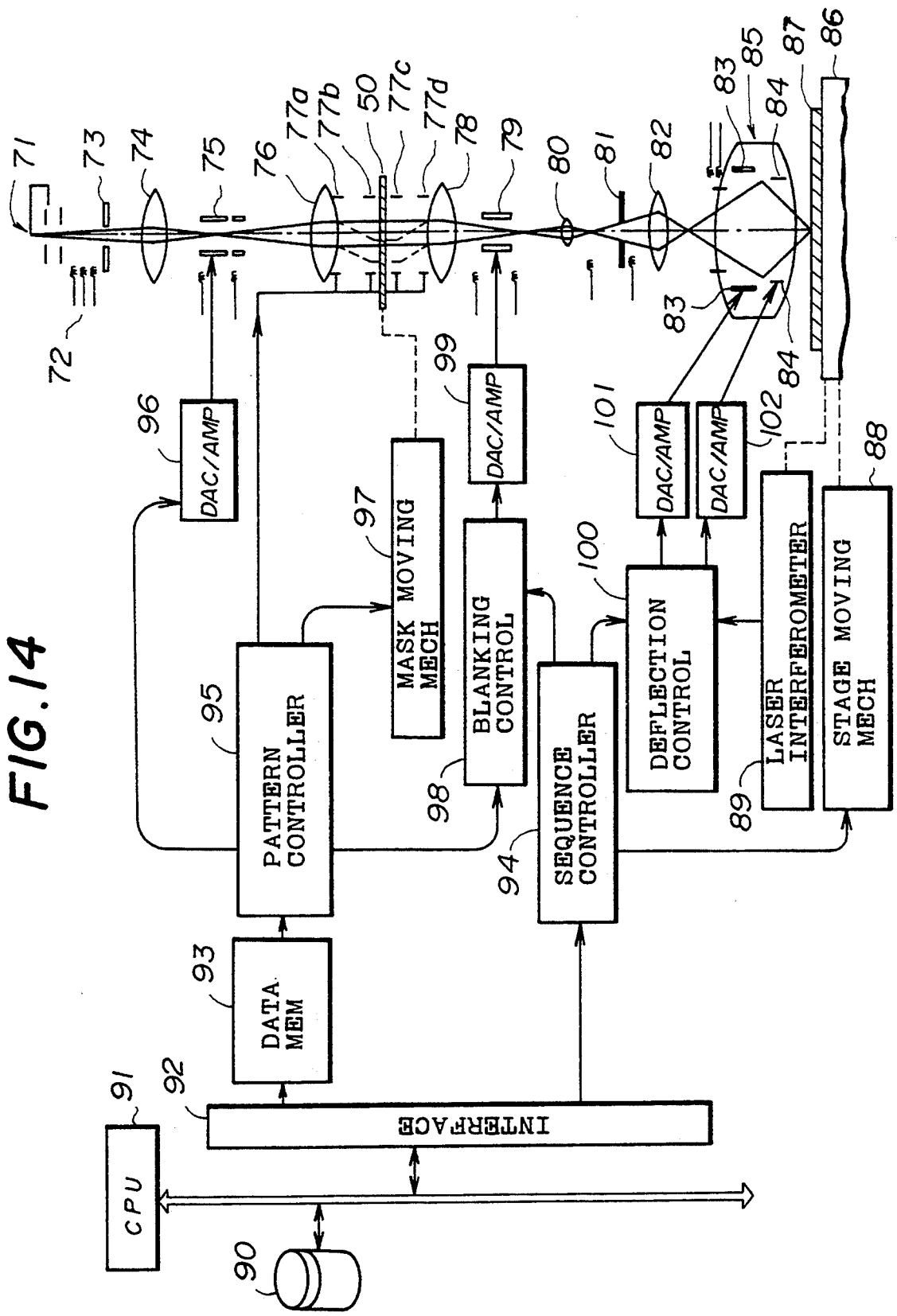
FIG. 14 generally shows an electron beam exposure apparatus to which the stencil mask produced by the present invention may be applied.

The electron beam exposure apparatus shown in FIG. 14 is provided with an electrostatic deflector means and an electromagnetic deflector means as the pattern select deflector means. The electromagnetic deflector means is used when selecting and exposing a basic pattern. On the other hand, the electrostatic deflector means is used when making the exposure which varies the size of the exposed rectangular pattern by varying the area of the rectangular opening irradiated by the electron beam which has the rectangular cross section.

In FIG. 14, an electron beam is emitted from an electron gun 71 as an example of the charged particle beam. The optical path of the electron beam is finely adjusted by alignment coils 72, and is shaped into an electron beam having a rectangular cross section by being passed through an aperture 73. The electron beam having the rectangular cross section is irradiated on the stencil mask 50 via an electron lens 74, a slit deflector 75, an electron lens 76 and alignment deflectors 77a and 77b.

The electron beam which is irradiated on the stencil mask 50 is deflected by the alignment deflectors 77a and 77b which is located on the upstream side relative to the stencil mask 50, so that the electron beam selectively irradiates only a selected one of the plurality of basic patterns provided on the stencil mask 50. The electron beam which is transmitted through the opening of the stencil mask 50 corresponding to the selected basic pattern is returned to its original optical axis by alignment deflectors 77c and 77d, and is directed to a reduction lens 80 via an electron lens 78 and a blanking deflector 79. The reduction lens 80 reduces the cross sectional area of the electron beam by 1/100, for example, and is passed through an aperture 81 and an electron lens 82 so as to be subjected to a focal correction. Thereafter, the electron beam reaches a projection lens 85.

The projection lens 85 includes a main deflector 83 which corresponds to the electromagnetic deflector means, and a sub deflector 84 which corresponds to the electrostatic deflector means. The projection lens 85 irradiates the electron beam which has a cross sectional shape corresponding to the selected basic pattern at a specified position on an object 87 which is placed on a stage 86. For example, the object 87 is a semiconductor wafer. The stage 86 is movable by a stage moving mechanism 88, and the position of the stage 86 is measured by a laser interferometer 89.

on the other hand, a memory unit 90 stores exposure data related to patterns which are to be drawn on the object 87. The stored exposure data is read out from the memory unit 90 under a control of a central processing unit (CPU) 91, and is stored in a data memory 93 via an interface circuit 92 on one hand, and is input to a sequence controller 94 on the other.

The data memory 93 stores data related to the shapes of the block patterns, and the data read out from the data memory 93 is input to a pattern controller 95. The pattern controller 95 generates a pattern data for selecting the basic pattern of the stencil mask 50 based on the data read out from the data memory 93. The pattern data generated by the pattern controller 95 is input to the alignment deflectors 77a through 77d, and to the slit deflector 75 via a digital-to-analog converter and amplifier (DAC/AMP) 96.

At the same time, the pattern data from the pattern controller 95 is input to a mask moving mechanism 97 to control the position of the stencil mask 50. As a result, the electron beam is selectively irradiated on only the opening of the stencil mask 50 corresponding to the selected basic pattern out of the basic patterns provided on the stencil mask 50. In addition, the pattern data is input to the blanking deflector 79 via a blanking control circuit 98 and a DAC/AMP 99 to drive and control the blanking deflector 79.

On the other hand, a control signal from the sequence controller 94 is input to a deflection control circuit 100 so that the deflection control circuit 100 generates a deflection data for controlling the irradiating position of the electron beam on the object 87. This deflection data is input to the main deflector 83 via a DAC/AMP 101 to drive and control the main deflector 83, so that the electron beam is deflected to a predetermined position within a large deflection range.

At the same time, the above deflection data is input to the sub deflector 84 via a DAC/AMP 102 to drive and control the sub deflector 84, so that the electron beam is deflected to a predetermined position within a small deflection range. In this state, the movement of the stage 86 is controlled by the sequence controller 94 via the stage moving mechanism 88.

The position of the stage 86 is measured by the laser interferometer 89 and position information output from the laser interferometer 89 is input to the deflection control circuit 100. Hence, the electron beam is irradiated at a predetermined position on the object 87. Therefore, the selected basic pattern is exposed on the object 87 by one shot of the electron beam, and by connecting such shots on the object 87, it is possible to draw on the object 87 a repeating pattern which is a repetition of the basic pattern.

In the embodiment described heretofore, the physical quantity of the small region, calculated when making the pattern check, is the temperature rise of the stencil mask that occurs when the electron beam irradiates the stencil mask. However, the physical quantity is not limited to that of the described embodiment, and may be the strength of the stencil mask with respect to a load, the stress generated on the stencil mask and the like.

FIG. 15 is a diagram for explaining a case where the strength of the stencil mask with respect to a load is used as the physical quantity when making the pattern check described above. FIG. 15 (A) shows a side view of an essential part of the stencil mask, and FIG. 15 (B) shows a plan view of this stencil mask.

In the case shown in FIG. 15, the elongated region of the stencil mask is divided into four rectangular regions $105_1$ through $105_4$, for example. If areas of these rectangular regions $105_1$ through $105_4$ are respectively denoted by S1 through S4 and a density of the stencil mask is denoted by d, the load at a boundary between the rectangular regions $105_3$ and $105_4$ and having a length L3 can be described by $(S1+S2+S3) \times d/L3$. Similarly, the load at a boundary between the rectangular region $105_4$ and the surrounding region and having a length L4 can be described by $(S1+S2+S3+S4) \times d/L4$ which is the maximum load within the elongated region.

Therefore, in the step 23 shown in FIG. 3, it is possible to decide whether or not the basic pattern defined by the elongated region shown in FIG. 15 should be prohibited from being formed in the stencil mask, by calculating the maximum load acting within the elongated region and prohibiting the basic pattern if the calculated maximum load exceeds a predetermined threshold value.

Of course, the pattern check in the step 23 shown in FIG. 3 may be based on one or a plurality of such physical quantities.

Further, the present invention is not limited to these embodiments, but various variations and modifications may be made without departing from the scope of the present invention.

What is claimed is:

1. A pattern judging method to be implemented on a computer for automatically determining whether or not a pattern should be formed in a mask, said pattern judging method comprising the steps of:

(a) dividing an area of the mask where a desired pattern is to be formed into a plurality of regions;

(b) calculating a predetermined physical quantity, based on a charged particle beam being irradiated in a predetermined pattern formed in each of the regions where one or a plurality of openings corresponding to the desired pattern are formed in the mask; and (c) forming the one or plurality of openings corresponding to the predetermined pattern in a corresponding region of the mask if the predetermined quantity calculated in step (b) does not exceed a threshold value for at least one of the regions.

2. The pattern judging method as claimed in claim 1, wherein said step (a) divides the area of the mask into the regions by forming a bit map which describes each of the regions by one bit.

3. The pattern judging method as claimed in claim 1, wherein the predetermined physical quantity is selected from a group consisting of a temperature rise at each region caused by a charged particle beam irradiated thereon, a load acting at each region, and a stress generated at each region.

4. The pattern judging method as claimed in claim 1, wherein the predetermined physical quantity is an arbitrary combination of quantities selected from a group consisting of a temperature rise at each region caused by a charged particle beam irradiated thereon, a load acting at each region, and a stress generated at each region.

5. The pattern judging method as claimed in claim 1, which further comprises the step of (d) dividing the desired pattern into a plurality of kinds of mutually independent patterns if the predetermined quantity calculated in the step (b) exceeds the threshold value for at least one of the regions, and said steps (a), (b) and (c) are repeated by taking each of the mutually independent patterns as the desired pattern.

6. The pattern judging method as claimed in claim 5, wherein said step (d) divides the desired pattern into one or a plurality of rectangular patterns and one pattern having an arbitrary shape.

7. The pattern judging method as claimed in claim 5, wherein said step (d) divides the desired pattern into one or a plurality of patterns which generally extend in a first direction and one or a plurality of patterns which generally extend in a second direction which is perpendicular to the first direction.

8. A mask producing method for producing a mask which is used for drawing patterns on an object by a charged particle beam transmitted through the patterns of the mask, said mask producing method comprising the steps of:

(a) extracting a pattern data related to a desired pattern which is to be formed in the mask;

(b) dividing an area of the mask where the desired pattern is to be formed into a plurality of regions;

(c) calculating a predetermined physical quantity, based on said charged particle beam being irradiated in a predetermined pattern formed in each of the regions where one or a plurality of openings corresponding to the predetermined pattern are formed in the mask, based on the extracted pattern data;

(d) determining whether or not the predetermined quantity calculated in step (c) exceeds a threshold value for all of the regions; and (e) forming the one or plurality of openings corresponding to the predetermined pattern in a corresponding region of the mask if step (d) determines that the predetermined quantity does not exceed the threshold value for each of the regions.

9. The mask producing method as claimed in claim 8, wherein said step (b) divides the area of the mask into the regions by forming a bit map which describes each of the regions by one bit.

10. The mask producing method as claimed in claim 8, wherein the predetermined physical quantity is selected from a group consisting of a temperature rise at each region caused by the charged particle beam irradiated thereon, a load acting at each region, and a stress generated at each region.

11. The mask producing method as claimed in claim 8, wherein the predetermined physical quantity is an arbitrary combination of quantities selected from a group consisting of a temperature rise at each region caused by the charged particle beam irradiated thereon, a load acting at each region, and a stress generated at each region.

12. The mask producing method as claimed in claim 8, which further comprises the step of (f) dividing the desired pattern into a plurality of kinds of mutually independent patterns if said step (d) determines that the predetermined quantity calculated in the step (c) exceeds the threshold value for at least one of the regions, and said steps (b), (c) and (d) are repeated by taking each of the mutually independent patterns as the desired pattern.

13. The mask producing method as claimed in claim 12, wherein said step (f) divides the desired pattern into one or a plurality of rectangular patterns and one pattern having an arbitrary shape.

14. The mask producing method as claimed in claim 12, wherein said step (f) divides the desired pattern into one or a plurality of patterns which generally extend in a first direction and one or a plurality of patterns which generally extend in a second direction which is perpendicular to the first direction.

15. The mask producing method as claimed in claim 8, wherein the desired pattern forms a unit of a pattern which is repeatedly used when drawing the patterns on the object by the charged particle beam.

* * * * *